(12) United States Patent
Su et al.

(10) Patent No.: US 9,883,601 B2
(45) Date of Patent: Jan. 30, 2018

(54) INTELLIGENT TERMINAL WITH IRREGULAR SHAPE BATTERY

(71) Applicant: ZTE Corporation, Shenzhen (CN)

(72) Inventors: Meichun Su, Shenzhen (CN); Wei Fu, Shenzhen (CN); Tuanhui Liu, Shenzhen (CN); Minghao Zhang, Shenzhen (CN)

(73) Assignee: XI'AN ZHONGXING NEW SOFTWARE CO. LTD., Xi'An (CN)

( * ) Notice: Subject to any disclaimer, the term of this patent is extended or adjusted under 35 U.S.C. 154(b) by 0 days.

(21) Appl. No.: 14/913,397

(22) PCT Filed: Nov. 11, 2013

(86) PCT No.: PCT/CN2013/086870
§ 371 (c)(1),
(2) Date: Feb. 22, 2016

(87) PCT Pub. No.: WO2014/169624
PCT Pub. Date: Oct. 23, 2014

(65) Prior Publication Data
US 2016/0205793 A1 Jul. 14, 2016

(30) Foreign Application Priority Data
Aug. 22, 2013 (CN) .......................... 2013 1 0370381

(51) Int. Cl.
*H04M 1/02* (2006.01)
*H05K 5/00* (2006.01)
(Continued)

(52) U.S. Cl.
CPC ........ *H05K 5/0017* (2013.01); *H01M 2/1022* (2013.01); *H01M 10/425* (2013.01); *H04M 1/0262* (2013.01); *H05K 5/0086* (2013.01)

(58) Field of Classification Search
CPC .. G06F 1/1635; H04M 1/0262; H04B 1/3883; H04R 25/602; H05K 5/0086; H05K 5/0017; H01M 2/02
(Continued)

(56) References Cited

U.S. PATENT DOCUMENTS 5,163,766 A * 11/1992 Fushimi ..................... B41J 3/36
101/288
5,583,744 A * 12/1996 Oguchi ................. G06F 1/1616
16/223
(Continued)

FOREIGN PATENT DOCUMENTS

CN            1310908 A        8/2001
CN          101388917 A        3/2009
(Continued)

OTHER PUBLICATIONS

International Search Report for corresponding application PCT/CN2013/086870 filed on Nov. 11, 2013; dated Apr. 3, 2014.
(Continued)

*Primary Examiner* — James Wu
(74) *Attorney, Agent, or Firm* — Cantor Colburn LLP

(57) ABSTRACT

Provided is an intelligent terminal, which includes a battery and a main board, and the battery and the main board are mounted in the shell of the intelligent terminal, and the battery at least half surrounds the main board.

7 Claims, 3 Drawing Sheets

(51) Int. Cl.
*H01M 2/10* (2006.01)
*H01M 10/42* (2006.01)

(58) Field of Classification Search
USPC .......................................................... 361/752
See application file for complete search history.

(56) References Cited

U.S. PATENT DOCUMENTS

| | | | | |
|---|---|---|---|---|
| 6,049,145 | A * | 4/2000 | Austin | H01M 2/1066 |
| | | | | 307/150 |
| 8,422,209 | B2 * | 4/2013 | Cheng | H01M 2/1022 |
| | | | | 361/679.01 |
| 8,971,039 | B2 * | 3/2015 | Huang | H01M 2/1022 |
| | | | | 361/679.41 |
| 2002/0006750 | A1 * | 1/2002 | Hidesawa | G06F 1/1616 |
| | | | | 439/625 |
| 2007/0123299 | A1 * | 5/2007 | Ragan | H04M 1/72522 |
| | | | | 455/556.1 |

FOREIGN PATENT DOCUMENTS

| | | |
|---|---|---|
| CN | 201355883 Y | 12/2009 |
| WO | 9903186 A1 | 1/1999 |
| WO | 2013093553 A1 | 6/2013 |

OTHER PUBLICATIONS

Supplementary European Search Report for corresponding application EP13882210, dated Oct. 4, 2016.

* cited by examiner

INTELLIGENT TERMINAL WITH IRREGULAR SHAPE BATTERY

TECHNICAL FIELD

The disclosure relates to a communication equipment technical filed, and in particular to an intelligent terminal.

BACKGROUND

At present the processer's speed of intelligent terminals are faster and faster, and the requirement of screen is bigger and bigger, which also has a trend to be thinner. Because of the big screen and other reasons, the power consumption is greatly increasing. So the high-capacity battery is needed. As shown in FIG. 1, a traditional battery 200 of an intelligent terminal is in a regular shape, such as square, and occupied a core location of the terminal. Because the layout of the battery 200 is considered firstly, the rest space is used for arranging a main board (100 and 101). In general, the main board is a broken board, an L-shaped board or a C-shaped board which matches the battery and is mounted in a shell of the terminal. The main board, as shown in the FIG. 1, uses a broken board structure and comprises the first sub-board 100 and the second sub-board 102. Electronic components are arranged on the first sub-board 100 and the second sub-board 101.

The structure design of the intelligent terminal has the following defects:

1. when using the broken board structure, the shape of the broken board is not continuous and at least one sub-board is needed to assist the main board. A Flexible Printed Circuit (FPC) is used to join the sub-boards together. The reliability of signal transmission between single boards is bad and the utilization of the board space is low. When the main board is L-shaped or C-shaped, it also leads to the low utilization of board space because the L-shaped or C-shaped main board is irregular in shape.

2. the battery occupies the most space of the terminal space, and the main board is irregular in shape or divided into a plurality of sub-boards. Due to the structure, it is not easy to radiate the heat and the electromagnetic compatibility may not be improved.

SUMMARY

The embodiment of the present disclosure provides an intelligent terminal which aims at improving the utilization of the board space and reducing heat generation of the whole machine and improving the electromagnetic compatibility.

According to one aspect of the present disclosure, an intelligent terminal is provided. The intelligent terminal comprises a battery and a main board that are mounted in a shell of the intelligent terminal, and the battery at least half surrounds the main board.

Preferably, a front projection of the battery is an irregular polygon and a front projection of the main board is a regular or an irregular polygon.

Preferably, the front projection of the battery is L-shaped and the front projection of main board is rectangular in shape or L-shaped.

Preferably, the front projection of the battery is U-shaped and the front projection of the main board is rectangular in shape or T-shaped.

Preferably, the battery is mounted immovably in the shell of the intelligent terminal.

Preferably, the intelligent terminal further comprises a power processing component, a signal processing component, an interface component and a memory, and the power processing component, the signal processing component, the interface component and the storage are arranged on the main board.

Preferably, the signal processing component comprises a baseband chip, a radio frequency chip and a power amplifier, and the baseband chip is arranged on one side of the main board, and the memory, which is opposite to the baseband chip, is arranged on the other side of the main board, and the radio frequency chip is arranged on one side of the main board, and the power amplifier, which is opposite to the radio frequency chip, is arranged on the other side of the main board; and the power processing component comprises battery connector and power management element, and the interface component comprises a USB interface, and the battery connector is connected to the battery and the main board, and the power management element and the USB interface are arranged near to the battery connector.

Preferably, the power management element, the baseband chip, the memory, the radio frequency chip and the power amplifier are evenly arranged on the main board.

In the intelligent terminal provided by the embodiment of the present disclosure, the shape, size and the location in the terminal of the main board are determined firstly. After arranging the main board, the shape of the battery is determined to be an irregular polygon based on the rest space. The battery can take advantage of the rest space of the terminal. Comparing with the traditional main board using the broken board structure, it does not need the Flexible Printed Circuit (FPC) to connect the broken sub-boards and the reliability of signal transmission (FPC) is improved; comparing with the L-shaped or C-shaped main board, it can reduce heat generation of the whole machine, improve the electromagnetic compatibility and increase the utilization of the board space.

DETAILED DESCRIPTION OF EMBODIMENTS

Figure 1:
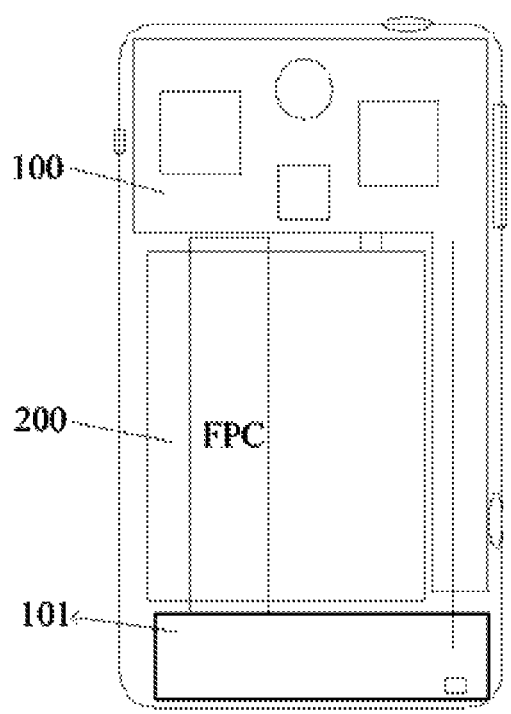
FIG. 1 shows a structure diagram of an intelligent terminal according to the related art.
Figure 2:
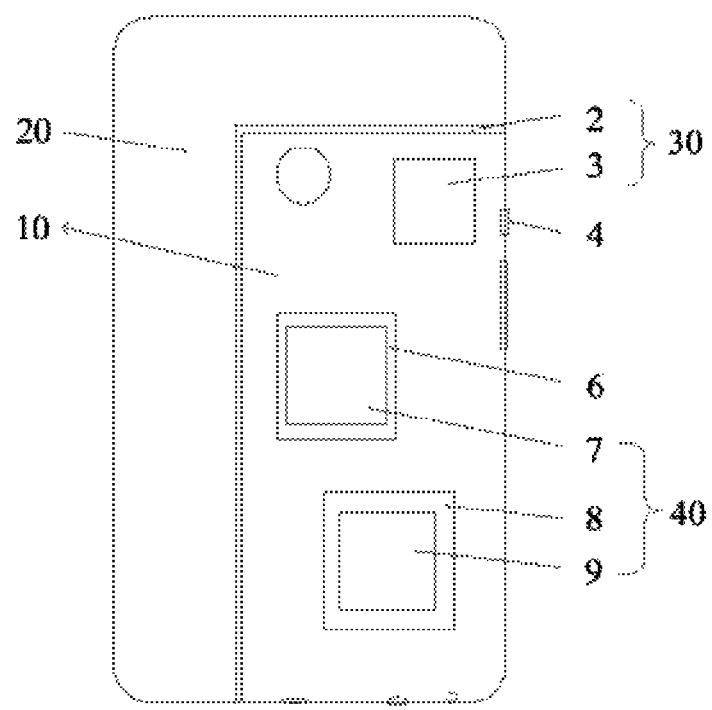
FIG. 2 shows a structure diagram of an intelligent terminal according to the first embodiment of the present disclosure.

As shown in FIG. 2, the first embodiment of the present disclosure provides an intelligent terminal, comprising a battery 20 and a main board 10 that are mounted in a shell of the intelligent terminal. The main board 10, as an important part of terminal, is not only a support body of electronic components, but also a provider for connecting electronic components. The intelligent terminal provided by the embodiment of the present disclosure may be a mobile phone or a tablet computer and so on.

The battery 20 at least half surrounds the main board 10. That is the battery 20 at least partially surrounds two adjacent sides of the main board 10.

The front projection of the battery 20 in the embodiment is an irregular polygon, and the shape of the front projection of the main board 10 matches the shape of the front projection of the battery 20.

Figure 3:
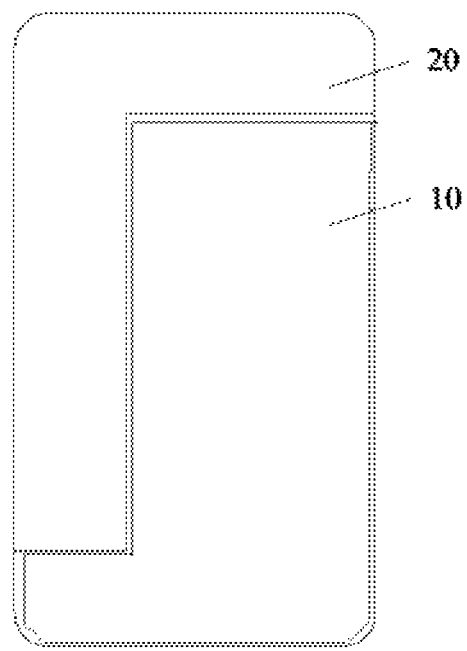
FIG. 3 shows a structure diagram of an intelligent terminal according to the second embodiment of the present disclosure.
Figure 4:
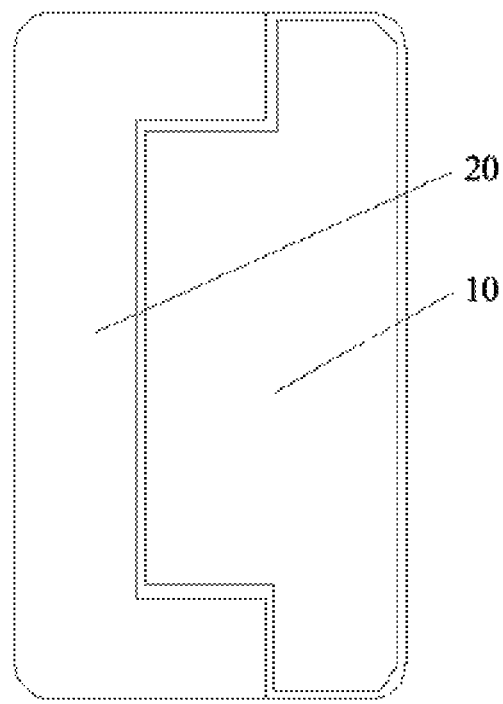
FIG. 4 shows a structure diagram of an intelligent terminal according to the third embodiment of the prevent disclosure.

The shape of the front projection of the main board 10 may be a regular polygon or irregular polygon and the front projection of the battery 20 may be L-shaped, U-shaped, T-shaped or other irregular polygonal. As shown in FIG. 3, when the front projection of the battery 20 is L-shaped, the front projection of the main board 10 is rectangular in shape or L-shaped which matches the front projection of the battery 20, and the battery 20 half surrounds the main board 10. As shown in FIG. 4, when the front projection of the battery 20 is U-shaped, the shape of the front projection of the main board 10 is rectangular in shape or T-shaped which matches the shape of the front projection of the battery 20, and the battery 20 half surrounds the main board 10. The shapes of the front projection of the battery 20 and the main board 10 are just examples which are used to explain the disclosure rather than to limit the disclosure. All the situations that the front projection of the battery 20 is irregular polygon and the front projection of the main board 10 matches the shape of the front projection of the battery 20 to enable the battery 20 to at least half surround the main board 10 are included in protection scope of the present disclosure.

When the intelligent terminal is designed according to the present disclosure, the shape of the main board 10, the size of the main board 10, and the location where the main board 10 is in the terminal are determined firstly. After arranging the main board 10, the shape of the battery 20 is determined based on the rest space of the terminal. Therefore, the battery 20 can take advantage of the rest space of the terminal to increase the capacity of the battery 20. The battery 20 is customized and unmovable. The unmovable characteristic improves the reliability of the battery 20.

Preferably, as shown in FIG. 2, the intelligent terminal further comprises a power processing component 30, a signal processing component 40, an interface component 4, the memory 6 and other electrical components. The power processing component 30, the signal processing component 40, the interface component 4 and the memory 6 are arranged on the main board 10, wherein the memory 6 is dual rate synchronous dynamic random memory.

After the above electronic components are arranged, the rest space is filled with the battery 20 based on the shape of the terminal. Since the shape of the main board 10, the size of the main board 10, and the location where the main board 10 is in the terminal, are determined preferably, the arrangement of the main board 10 is so flexible and compact that it can effectively make use of the area of main board 10 and determine the minimum area. The terminal only uses one main board and the rest space is filled with the battery 20. The present embodiment only uses one main board 10, which makes all functional connect to earth well, provides good protection for components which are sensitive for electromagnetic compatibility and improves the electromagnetic compatibility of the terminal.

The power processing component 30 comprises battery connector 2 and power management element 3, and the interface component 4 comprising a USB interface. The power management element 3 is a highly integrated power management component which is applied to a portable device. The power management element 3 realizes higher power convention efficiency and lower power consumption by integrating traditional independent power management components into a packaging. The battery connector 2 is configured to connect the battery 20 to the main board 10, and the power management element 3 and the USB interface are arranged near to the battery connector 2. The arrangement of USB interface, power management element 3 and battery connector 2 is compact so that it can reduce the FPC connection and the heat generation when charging.

The signal processing component 40 comprises a baseband chip 7, a radio frequency chip 8, a power amplifier 9, an earphone 11 and a main microphone 12. The baseband chip 7 is configured to synthesize a baseband signal to be sent or configured to decode the received baseband signal. The radio frequency chip 8 is configured to send or receive a signal. The memory 6 is arranged on one side of the main board 10, the baseband chip 7 is arranged on the other side of the main board 10 and is opposite to the memory 6, the radio frequency chip 8 is arranged on one side of the main board 10, and the power amplifier 9 is arranged on the other side of the main board 10 and is opposite to the radio frequency chip 8.

The power management element 3, a component consisting of the baseband chip 7 and the memory 6, a component consisting of the radio frequency chip 8 and the power amplifier 9, which are three heating components, are evenly arranged on the main board. Such arrangement may avoid the problem of heat concentration.

It can be seen from the description that the intelligent terminal provided by the embodiment of the present disclosure that the shape of the main board, the size of the main board and the location where the main board is in the terminal are determined preferably. After arranging the main board, the shape of the battery is determined to be an irregular polygon based on the rest space to enable the battery to take advantage of the rest space of the terminal. Comparing with the traditional main board using the broken board structure, the intelligent terminal provided by the embodiment of the present disclosure need not the FPC to connect the broken sub-boards, and can improve the reliability of signal transmission; comparing with the L-shaped or C-shaped main board, it can reduce heat generation of the whole machine, improve the electromagnetic compatibility and increase the utilization of the board space.

The above, they are just preferred embodiments used to explain the present disclosure rather than to limit the present disclosure. Any equivalent structures or process transformation based on the description or briefs of the present disclosure and the direct or indirect application in relevant art are both included in the protection scope of the present disclosure.

INDUSTRIAL APPLICABILITY

As mentioned above, the intelligent terminal provided by the embodiment of the present disclosure has the following effect: improving the utilization of board space, reducing the heat generation of the whole machine and improving the electromagnetic compatibility of the machine.

What is claimed is:

1. An intelligent terminal, comprising a battery and a main board that are mounted in a shell of the intelligent terminal, wherein the battery at least half surrounds the main board;
the intelligent terminal further comprises a power processing component, a signal processing component, an interface component and a memory, wherein the power processing component, the signal processing component, the interface component and the memory are arranged on the main board; wherein
the signal processing component comprises a baseband chip, a radio frequency chip and a power amplifier, the baseband chip is arranged on one side of the main board, the memory is arranged on the other side of the main board and is opposite to the baseband chip, the radio frequency chip is arranged on one side of the main board, and the power amplifier is arranged on the other side of the main board and is opposite to the radio frequency chip; and the power processing component comprises a battery connector and a power management element, the interface component comprises a USB interface, the battery connector is configured to connect the battery to the main board, and the power management element and the USB interface are arranged near to the battery connector.

2. The intelligent terminal according to claim 1, wherein a front projection of the battery is an irregular polygon and a front projection of the main board is a regular or an irregular polygon.

3. The intelligent terminal according to claim 2, wherein the front projection of the battery is L-shaped and the front projection of the main board is rectangular in shape or L-shaped.

4. The intelligent terminal according to claim 2, wherein the front projection of the battery is U-shaped and the front projection of the main board is rectangular in shape or T-shaped.

5. The intelligent terminal according to claim 1, wherein the battery is mounted immovably in the shell of the intelligent terminal.

6. The intelligent terminal according to claim 1, wherein the power management element, the baseband chip, the memory, the radio frequency chip and the power amplifier are evenly arranged on the main board.

7. The intelligent terminal according to claim 2, wherein the battery is mounted immovably in the shell of the intelligent terminal.

* * * * *